United States Patent
Chiu

(12) 
(10) Patent No.: US 6,782,612 B2
(45) Date of Patent: Aug. 31, 2004

(54) MANUFACTURING PROCESS OF IC MODULE

(76) Inventor: Wen-Wen Chiu, No. 15, Alley 16, Lane 576, Sec. 1, Kuang Fu Rd., Tung Zone, Hsin Chu City (TW)

( * ) Notice: Subject to any disclaimer, the term of this patent is extended or adjusted under 35 U.S.C. 154(b) by 184 days.

(21) Appl. No.: 10/046,208

(22) Filed: Jan. 16, 2002

(65) Prior Publication Data

US 2003/0131471 A1 Jul. 17, 2003

(51) Int. Cl.$^7$ ................................................. H05K 3/34
(52) U.S. Cl. .............................. 29/840; 29/825; 29/827; 174/524; 235/488; 235/492
(58) Field of Search .................. 29/827, 840; 174/52.4; 239/488, 492

(56) References Cited

U.S. PATENT DOCUMENTS

| | | | | |
|---|---|---|---|---|
| 4,603,249 A | * | 7/1986 | Hoppe et al. | |
| 4,617,216 A | * | 10/1986 | Haghiri-Tehrani et al. | |
| 4,674,175 A | * | 6/1987 | Stampfli | |
| 4,709,254 A | * | 11/1987 | Haghiri-Tehrani et al. | |
| 4,746,392 A | * | 5/1988 | Hoppe | |
| 4,835,846 A | * | 6/1989 | Juan et al. | |
| 5,951,813 A | * | 9/1999 | Warren | |

FOREIGN PATENT DOCUMENTS

| | | |
|---|---|---|
| TW | 344853 | 11/1998 |
| TW | 396553 | 1/2000 |

* cited by examiner

*Primary Examiner*—Carl J. Arbes
(74) *Attorney, Agent, or Firm*—Browdy and Neimark, P.L.L.C.

(57) ABSTRACT

The present invention is to provide a manufacturing process of an integrated circuit module comprising the following steps: (a) providing a circuit board, which has at least one module circuit pattern thereon, said circuit pattern having at least one chip assembly area and an electronic element assembly area; (b) mounting at least one substrate on said at least one chip assembly area; said substrate is provided thereon with at least one connecting circuit pattern which is electrically connected to the at least one module circuit pattern of said circuit board; (c) mounting at least one IC chip on said at least one substrate such that said IC chip is electrically connected to said connecting circuit pattern of the substrate.

11 Claims, 5 Drawing Sheets

MANUFACTURING PROCESS OF IC MODULE

FIELD OF THE INVENTION

The present invention relates generally to a manufacturing process of an IC module, and more particularly to a manufacturing process that can reduce the manufacturing cost of IC module and enhance the repairing speed for changing its chip.

BACKGROUND OF THE INVENTION

According to the conventional manufacturing process of IC module, it first assembles IC chips that have been fully encapsulated and tested to a printed circuit board, and then tests the module to finish the IC module manufacturing. Taiwan patent No. 98,736 (publication No. 344,853) discloses a different manufacturing process of IC Module. It directly assembles IC chips to a printed circuit board, and then the chips are electrically connected to the circuit board by bonding wires. Finally, the chips are encapsulated by synthesis resin on the circuit board. Such a manufacturing process can adopt one-off manufacturing process from assemblage to module product. It is more simple and time-saving than the conventional process, which has to adopt multiple section divided process in IC encapsulation, IC testing and module assembly. However, the process disclosed in the foregoing Taiwan patent does not assemble the electronic elements until the chips have been bonded and encapsulated. Therefore, not only it is easy to cause the problems that the chip is damage, the bonding wires break and the encapsulation is distorted to increase the ineligible rate of the whole module, but also it is not easy to repair and replace the ineligible chips because the chips have been encapsulated in advance.

Taiwan patent No. 118,728 (publication No. 396,553) was filed by the present applicant to solve the above problems. However, no matter the patent No. 98,736, or the patent No. 118,728 in Taiwan, R.O.C., both of them assemble the IC chips on the printed circuit board directly for wire bonding, so the whole circuit board should be specially arranged so as to ensure a firmer connections between the conductor pattern of the printed circuit board and the bonding wires. For example, if the gold bonding wire is used as the electronic connecting bridge, the connecting portion of the conductor pattern of the circuit board should be specially gilded, so that the manufacturing cost of the circuit board will relatively increase. Next, if the chip has to be changed for repair, both of the two Taiwan patents have to remove the bonding wires that connect the conductor pattern of the circuit board and the chip one by one, then take the old chip away and assemble the new one, finally bond the wire. Consequently, the efficiency of changing the chip sometimes is not high. Moreover, it is quite possible to peel off the gilding of the conductor pattern of the circuit board at the time when the bonding wires are removed, so that the circuit board cannot be reused; consequently, the action to change the chip should be taken carefully, which further affected the speed of the repair action. Otherwise, both the two inventions may adopt the flip chip technology to connect the chip and the circuit board electronically to get rid of the shortcomings of the above-mentioned wire bonding connection method. However, no matter the wire bonding method or flip chip method to connect the circuit board and the chip, once the chip has been encapsulated by the isolating resin, it is rather difficult to replace it, which affects the speed of the repair action.

SUMMARY OF THE INVENTION

The primary objective of the present invention is to provide a manufacturing process of an IC module which its circuit board need not be specially disposed so as to reduce the manufacturing cost of the circuit board.

It is another objective of the present invention to provide a manufacturing process of an IC module that can effectively enhance the speed for changing the chip thereon.

It is another objective of the present invention to provide a manufacturing process of an IC module that can ensure not to damage the circuit board during changing the chip for repair such that the circuit board can be reused.

It is still another objective of the present invention to provide a manufacturing process of an IC module that can effectively enhance the speed for changing the chip even if the chip has been encapsulated by the resin.

In order to achieve the above objectives, the present invention provides a manufacturing process of an IC module comprising the following steps: (a) providing a circuit board, which has at least one module circuit pattern thereon, said circuit pattern having at least one chip assembly area and an electronic element assembly area; (b) mounting at least one substrate on said at least one chip assembly area; said substrate is provided thereon with at least one connecting circuit pattern which is electrically connected to the at least one module circuit pattern of said circuit board; (c) mounting at least one IC chip on said at least one substrate such that said IC chip is electrically connected to said connecting circuit pattern of the substrate.

DETAILED DESCRIPTION OF THE INVENTION

Figure 1:
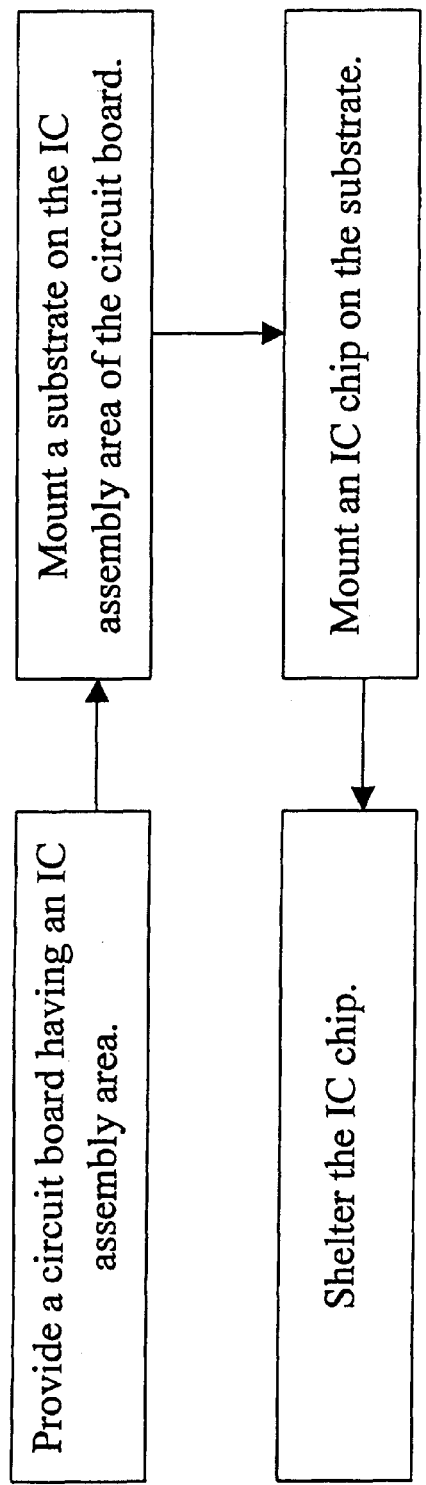
FIG. 1 is a flow chart of a preferred embodiment of the present invention.
Figure 2:
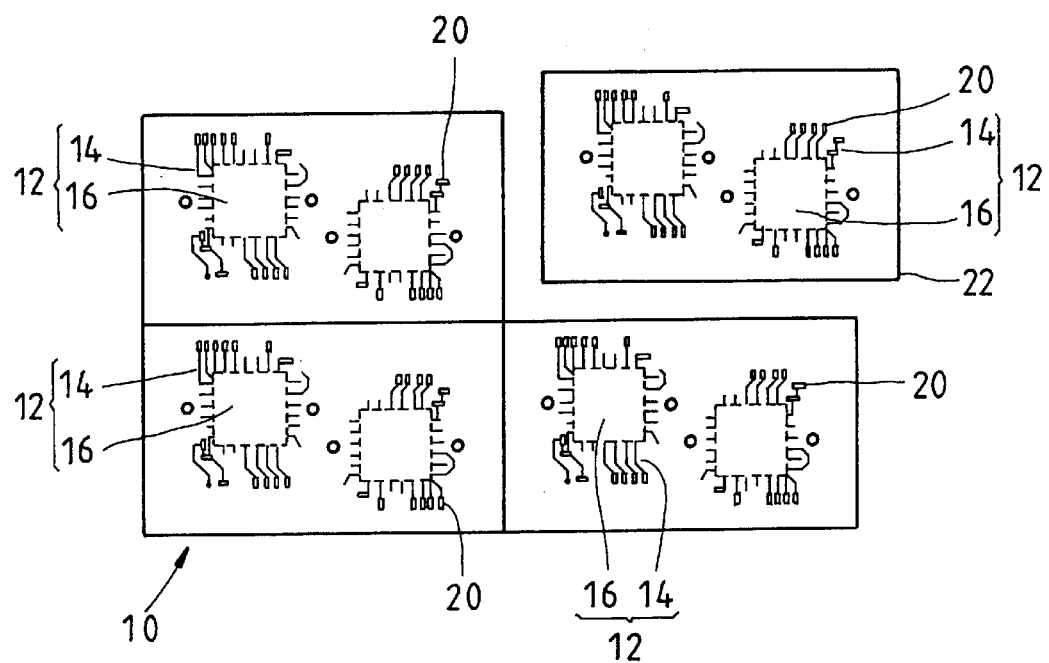
FIGS. 2–8 are schematic views of the preferred embodiment of the present invention illustrating the steps of the manufacturing process.

As shown in all FIGS., a manufacturing process of an IC module according to a preferred embodiment of the present invention comprises the steps as follows:

(a) First, we take a single layer or a multi-layer circuit board 10, which can be made of plastic, fiberglass, reinforced plastic, ceramic material, etc. The circuit board 10 is provided on the top surface thereof with a plurality of module circuit patterns 12, each of which has two chip assembly areas 16 for assembling two IC chips and an electronic element assembly area 14 for assembling a given number and type of electronic elements 20, so that the electronic elements 20 can be connected with the module circuit pattern 12 electronically. Next, the circuit board 10 can be cut into several circuit board units 22, each of which contains only one module circuit pattern 12 having two chip assembly areas 16 and one electronic element assembly area 14, as shown in FIG. 2.

Figure 3:
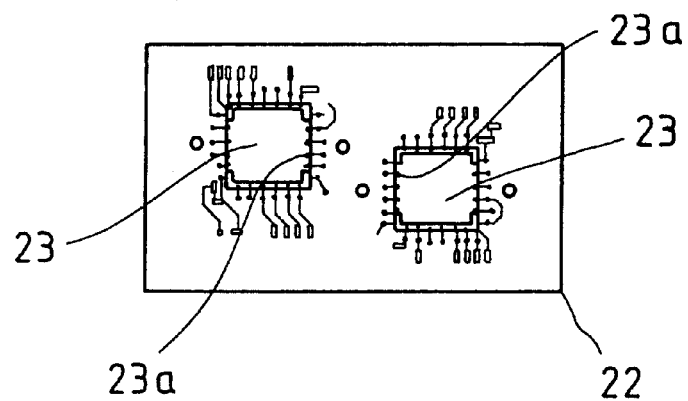
Figure 4:
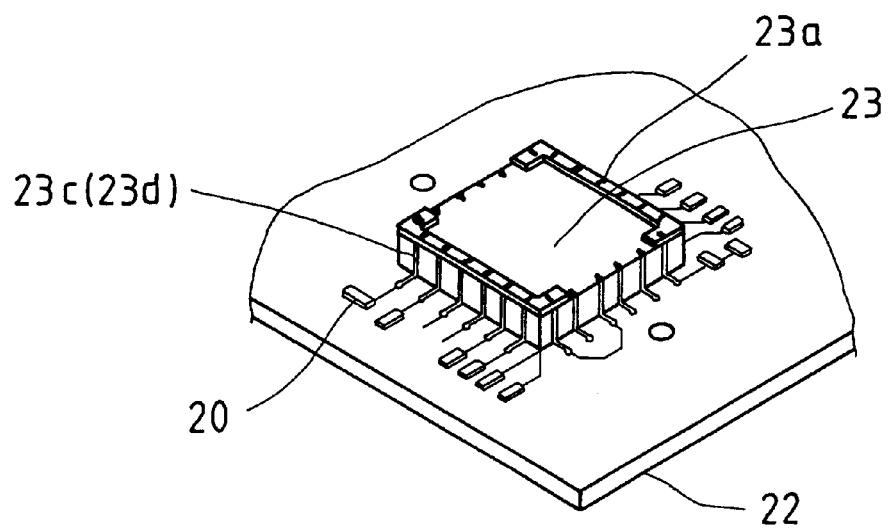

(b) Next, we mount a plurality of substrates 23 on the chip assembly areas 16 of the circuit board 10 respectively. The substrate 23 can be made of any type of single-layer or multi-layer circuit board. The substrate 23 is provided on the top surface thereof with a specially gilded connecting circuit pattern 23a. A plurality of semi-cylindrical plated through holes 23c are extended from the top surface to the bottom surface of the substrate 23 and are disposed around the lateral periphery of the substrate 23 in corresponding in locations to the terminal ends of the connecting circuit pattern 23a. When installing, the substrate 23 is fixed on the chip assembly area of the circuit board by filling tin solder 23d or conductive glue or other conductive material in the through holes 23c such that the module circuit pattern 12 of the circuit board 10 and the connecting circuit pattern 23 of the substrate 23 are electrically connected with each other, as shown in FIGS. 3–4.

Figure 5:
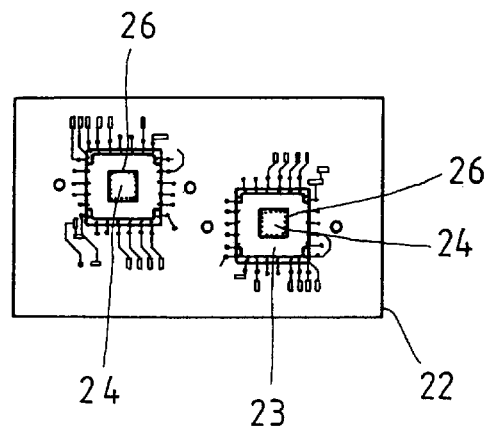
Figure 6:
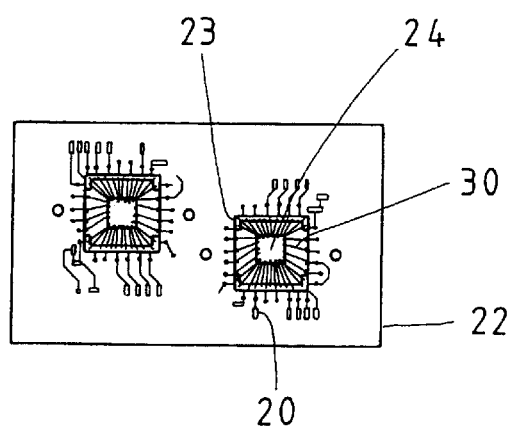
Figure 7:
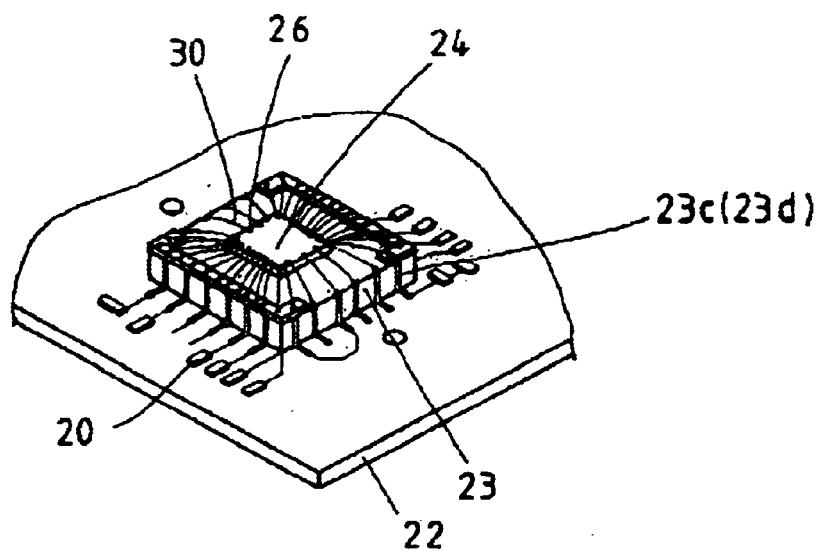

(c) As shown in FIG. 5, we thereafter mount IC chips 24 on the central portion of the top surface of the substrate 23 by means of epoxy resin, silicon resin, double-side adhesive tape, etc. The IC chip 24 is provided at the top surface with a plurality of bonding pads 26 acting as the input/output connecting ports of the IC chip. The bonding pads are connected to the connecting circuit pattern 23a of the substrate 23 by a plurality of gold bonding wires 30 respectively such that the IC chip 24, the module circuit pattern 12 and the electronic elements 20 are electrically connected thereamong. As a result, the initial assembly of the whole IC module is finished, as shown in FIG. 6 and FIG. 7.

(d) After the above steps, the practical function of the module circuit board unit 22 can be tested. At first, test whether the practical function of the module is good, if it is normal, then go on to the next proceeding of the manufacturing process. If it is abnormal, test whether the electronic elements 20 itself, the connection between the electronic elements 20 and the module circuit pattern 12, the IC chip 24 itself and the connection between the IC chip 24 and the connecting circuit pattern 23a are good respectively, and repair or change them accordingly so as to ensure the normal operation of the whole module.

Figure 8:
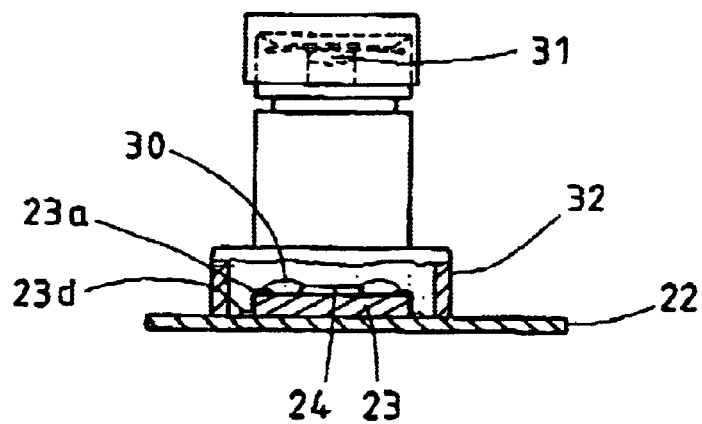

In addition, after the above steps, we can shelter the IC chip 24 by means of a cover body which is covered onto the circuit board unit 22 and surrounding said substrate 23. As shown in FIG. 8, the cover body 32 of the preferred embodiment is a lens barrel having at lease one optical lens 31 inside. Additionally, we may also shelter the IC chip 24 by means of synthetic resin, such as epoxy resin, silicon resin, etc., such that the IC chip and the connection between the IC chip 24 and the connecting circuit pattern 23a are encapsulated in the synthetic resin so as to obtain the complete IC module product.

The advantages of present invention are described hereunder.

1. The present invention provides the substrate 23 acting as an electrical bridge between the IC chip 24 and the module circuit pattern 12 of the circuit board 10 (circuit board unit 22) such that terminal ends of the module circuit pattern 12 need not gild or other special disposal. And, the terminal ends of the connecting circuit pattern 23a of the substrate 23 that should be specially gilded can be controlled in a very small area; during manufacturing, the substrates can be integrated in a large circuit board, and then cut into a determined size so as to save the manufacturing time and cost.

2. During functional testing, if the IC chip 24 is damaged or the bonding wires 30 break, it can be repaired on the top surface of the substrate 23. Next, during removing the old bonding wires, if the gild on the connecting pad 26 of the connecting circuit pattern 23a of the substrate 23 are peeled off or damaged by accident so that the substrate 23 cannot be installed with a new IC chip thereon, since the substrate 23 is mounted on the chip assembly area 16 of the circuit board 10 by surface-mount technology with solder which can be remove easily according to the present technology, the bad substrate can be removed easily from the circuit board 10 without damaging the circuit board such that a new substrate can be remounted on the circuit board as an electrical bridge again. In other words, the present invention can directly change the substrate for repair and it can ensure that the circuit board is not damaged for reuse so as to enhance the repairing speed.

3. If it is found that the IC chip 24 is damaged during functional testing of the IC module, even if the IC chip has been encapsulated by resin for protection, it can change a new substrate with a new IC chip directly as mentioned above so as to enhance the repairing efficiency.

Moreover, the applicant would like to recite herewith that the circuit board can also be cut into the circuit board units after the whole IC chip assembly and testing procedures have been finished, so that the fabricator can assemble many modules on a large area of a circuit board at the same time. Next, the step that assembles the electronic elements on the circuit board can also be carried out after the whole IC chips have been assembled, such adjustment of the steps will not influence the effect of the invention. Further, according to the preferred embodiment of the present invention, the connecting circuit pattern of the substrate is electrically connected to the module circuit pattern of the circuit board by means of Plated-Through-Hole technology (PTH). However, it is not the only way. In addition, according to the preferred embodiment of the present invention, the IC chip is electrically connected to the connecting circuit pattern of the substrate by means of so-called wire bonding technology. However, in practical manufacturing, the IC chip can be also electrically connected to the connecting circuit pattern of the substrate by means of so-called flip chip technology which will not influence the effect of this invention.

What is claimed is:

1. A manufacturing process of an integrated circuit module comprising the following steps:

(a) providing a circuit board, which has at least one module circuit pattern thereon, said circuit pattern having at least one chip assembly area and an electronic element assembly area;

(b) mounting at least one substrate on said at least one chip assembly area; said substrate is provided thereon with at least one connecting circuit pattern which is electrically connected to the at least one module circuit pattern of said circuit board;

(c) mounting at least one IC chip on said at least one substrate such that said IC chip is electrically connected to said connecting circuit pattern of the substrate; and (d) sheltering said IC chip after the step (c), wherein said IC chip is sheltered by means of a cover body covered onto the circuit board and surrounding said substrate, and wherein said cover body is provided with an optical lens.

2. The manufacturing process as defined in claim 1 further comprising a step of installing at least one electronic element on said electronic element assembly area such that the electronic element is electrically connected to said module circuit pattern of said circuit board before the step (c).

3. The manufacturing process as defined in claim 1 further comprising a step of installing at least one electronic element on said electronic element assembly area such that the electronic element is electrically connected to said module circuit pattern of said circuit board after the step (c).

4. The manufacturing process as defined in claim 1 further comprising a step of cutting said circuit board into a circuit board unit containing only one said module circuit pattern before the step (c).

5. The manufacturing process as defined in claim 1 further comprising a step of cutting said circuit board into a circuit board unit containing only one said module circuit pattern after the step (c).

6. The manufacturing process as defined in claim 1, wherein said substrate is provided with a bottom surface, a top surface having said connecting circuit pattern and at least one through hole passing from the top surface to the bottom surface and plating with a conductive material such that said connecting circuit pattern is electrically connected to said module circuit pattern by said through hole.

7. The manufacturing process as defined in claim 6, wherein said connecting circuit pattern is electrically connected to said module circuit pattern by said through hole filled with tin solder.

8. The manufacturing process as defined in claim 6, wherein said connecting circuit pattern is electrically connected to said module circuit pattern by said through hole filled with conductive glue.

9. The manufacturing process as defined in claim 6, wherein said through hole is disposed around the lateral periphery of said substrate.

10. The manufacturing process as defined in claim 1, wherein said IC chip is electrically connected to said substrate by means of wire bonding technology.

11. The manufacturing process as defined in claim 1, wherein said IC chip is electrically connected to said substrate by means of flip chip technology.

* * * * *